US011483953B2

(12) United States Patent
Sawada

(10) Patent No.: US 11,483,953 B2
(45) Date of Patent: Oct. 25, 2022

(54) MEASUREMENT DEVICE AND MEASUREMENT METHOD

(71) Applicant: FUJI CORPORATION, Chiryu (JP)

(72) Inventor: Toshiyuki Sawada, Toyota (JP)

(73) Assignee: FUJI CORPORATION, Chiryu (JP)

( * ) Notice: Subject to any disclaimer, the term of this patent is extended or adjusted under 35 U.S.C. 154(b) by 574 days.

(21) Appl. No.: 16/483,313

(22) PCT Filed: Feb. 14, 2017

(86) PCT No.: PCT/JP2017/005250
§ 371 (c)(1),
(2) Date: Aug. 2, 2019

(87) PCT Pub. No.: WO2018/150446
PCT Pub. Date: Aug. 23, 2018

(65) Prior Publication Data
US 2019/0380236 A1   Dec. 12, 2019

(51) Int. Cl.
*G01R 31/26* (2020.01)
*G01R 31/28* (2006.01)
*G01R 1/04* (2006.01)
*G01R 1/067* (2006.01)
*G01R 1/073* (2006.01)
*H05K 13/08* (2006.01)
*H05K 13/04* (2006.01)

(52) U.S. Cl.
CPC ....... *H05K 13/082* (2018.08); *G01R 31/2808* (2013.01); *H05K 13/0409* (2018.08)

(58) Field of Classification Search
CPC ........ H05K 13/04; H05K 13/08; G01R 31/26; G01R 31/28; G01R 1/04; G01R 1/067; G01R 1/073
See application file for complete search history.

(56) References Cited

U.S. PATENT DOCUMENTS 9,929,061 B2    3/2018  Cho et al.
2018/0203041 A1*  7/2018  Sawada ................ G01R 1/0416

FOREIGN PATENT DOCUMENTS

JP   52-30703       8/1977
JP   55-112263 U    8/1980
(Continued)

OTHER PUBLICATIONS

International Search Report dated May 23, 2017 in PCT/JP2017/005250 filed on Feb. 14, 2017.
(Continued)

*Primary Examiner* — Neel D Shah
(74) *Attorney, Agent, or Firm* — Oblon, McClelland, Maier & Neustadt, L.L.P.

(57) ABSTRACT

In the measurement device, electrical characteristics of a component can be measured adequately even if the component size is small. In the measurement device, at least a part of the component holding section is an antistatic section made of an antistatic material. Since the surface resistance of the antistatic section is large, it is possible to measure the electrical characteristics of a component in a state where the component is held by the antistatic section. Therefore, even if the size of the component is small, scattering of the component is prevented and the electrical characteristics can be adequately measured.

8 Claims, 8 Drawing Sheets

(56) References Cited

FOREIGN PATENT DOCUMENTS

| JP | 2-2898 U | 1/1990 |
|----|----------|--------|
| JP | 2523287 Y | 1/1997 |
| JP | WO2017/009987 A1 | 1/2019 |
| WO | WO 2017/009986 A1 | 1/2017 |

OTHER PUBLICATIONS

Office Action dated Dec. 28, 2021 in corresponding Japanese Patent Application No. 2021-011112 (with English Translation), 7 pages.

* cited by examiner

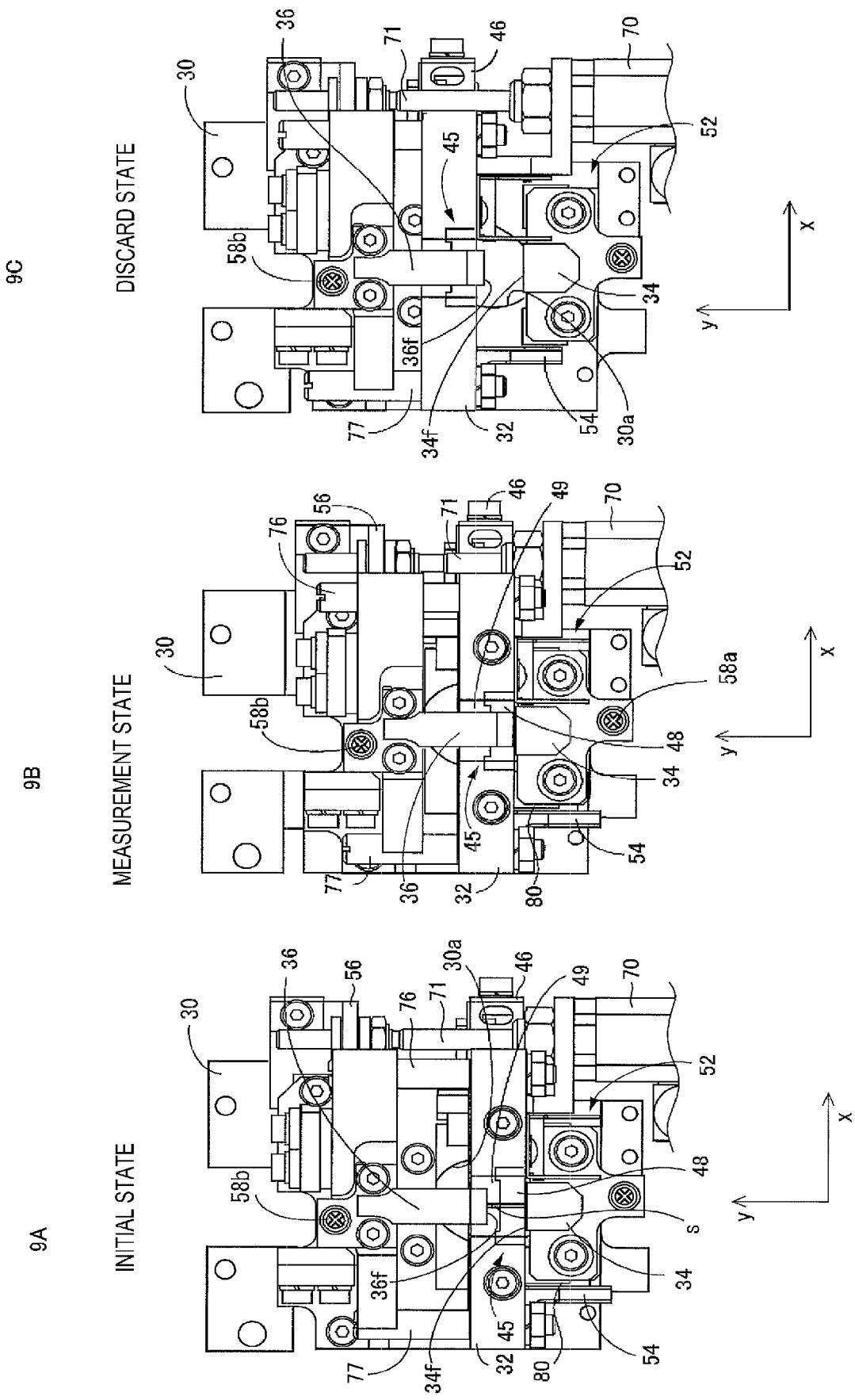

MEASUREMENT DEVICE AND MEASUREMENT METHOD

TECHNICAL FIELD

The present disclosure relates to a measurement device that measures electrical characteristics of a component mounted on a circuit board and a method for measuring electrical characteristics of a component.

BACKGROUND ART

Patent Literature 1 and 2 describe a measurement device which includes a holding table having a component holding section that holds a component and a pair of measurement parts capable of measuring electrical characteristics with the component interposed therebetween. In the measurement device described in Patent Literature 1, the component holding section is made of a conductive material. For this reason, the electrical characteristics of the component are measured in a state in which the component holding section (i.e., the holding table) is separated from the component after the component is gripped by the pair of measurement parts. In the measurement device described in Patent Literature 2, the component held by the component holding section is gripped by the pair of measurement parts and the electrical characteristics are measured. In Patent Literature 2, there is no description of the material the component holding section is made of.

PATENT LITERATURE

Patent Literature 1: WO 2017/009987 A1
Patent Literature 2: JP-A-52-30703

BRIEF SUMMARY

Technical Problem

An object of the present disclosure is to adequately measure electrical characteristics of a component even if the component is small.

Solution to Problem

Advantageous Effect

A measurement device according to the present disclosure includes a component holding section and a pair of measurement parts, and at least a part of the component holding section is an antistatic section made of a material having antistatic properties (hereinafter, referred to as an antistatic material). Since surface resistance of the antistatic section is large, electrical characteristics of the component can be measured in a state where the component is held by the antistatic section.

Meanwhile, in the measurement device described in Patent Literature 1, as described above, the component holding section is separated from the component after the component is gripped by the pair of measurement parts. For this reason, if the size of the component is small, the component may fly off resulting in the electrical characteristics not being measured. In contrast, the measurement device according to the present disclosure does not require separating of the antistatic section of the component holding section from the component when the electrical characteristics of the component are being measured. Therefore, even if the size of the component is small, flying off of the component can be prevented, and the electrical characteristics can be adequately measured. Also, in the measurement device according to the present disclosure, it is needless to say that the electrical characteristics can be adequately measured when the component is large.

BRIEF DESCRIPTION OF DRAWINGS

FIG. 9A is a diagram showing an initial state of the measurement device. FIG. 9B is a diagram showing a measurement state of the measurement device. FIG. 9C is a diagram showing a discarding state of the measurement device.

DESCRIPTION OF EMBODIMENTS

Figure 1:
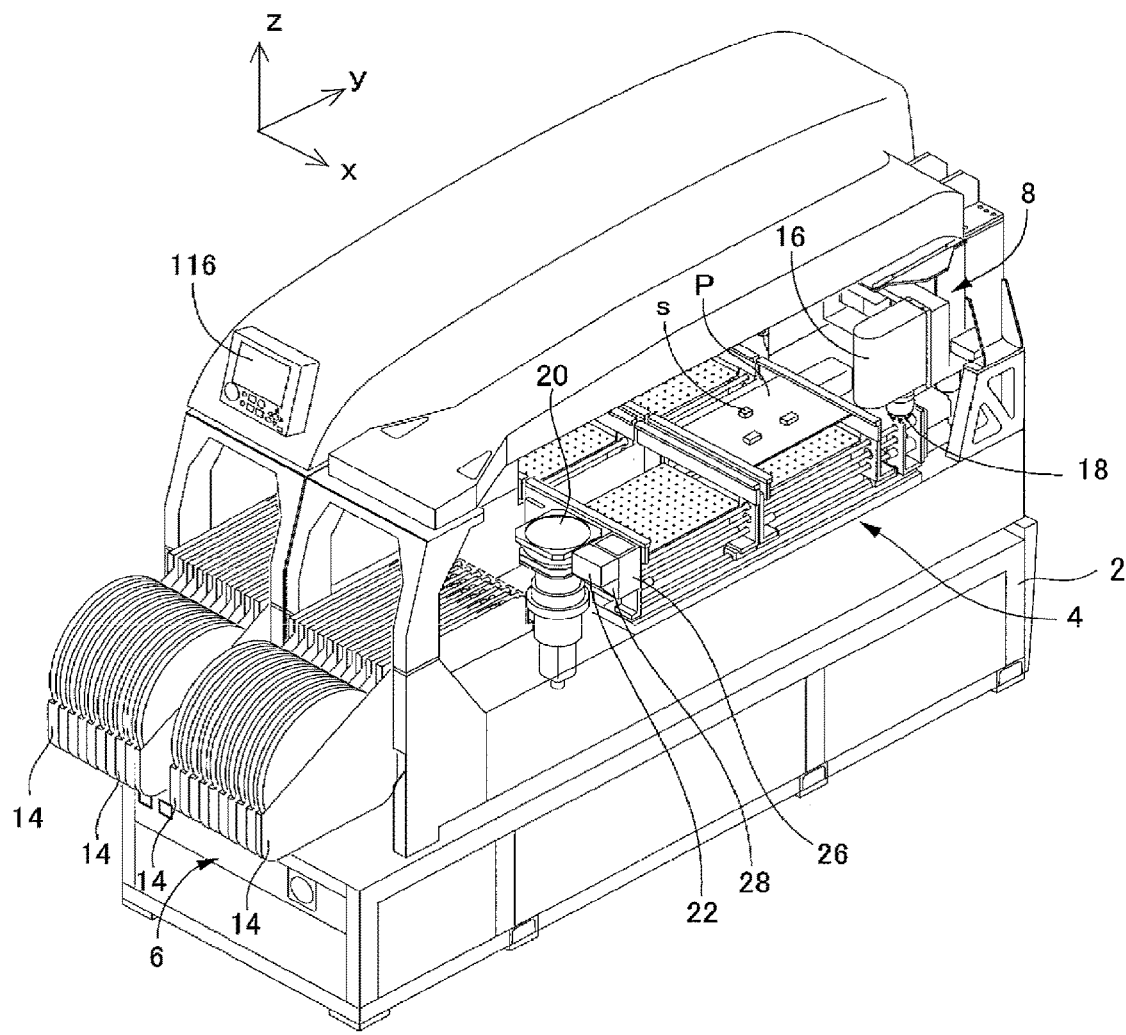
FIG. 1 is a perspective view of a mounting machine including a measurement device according to an embodiment of the present disclosure. In the measurement device, a measurement method according to an embodiment of the present disclosure is implemented.

Hereinafter, a mounting machine including a measurement device according to an embodiment of the present disclosure will be described in detail with reference to the drawings. In the measurement device, a measurement method according to an embodiment of the present disclosure is implemented. The mounting machine shown in FIG. 1 mounts a component to a circuit board and includes device main body 2, circuit board conveyance and holding device 4, component supply device 6, and head moving device 8. Circuit board conveyance and holding device 4 conveys and holds circuit board P (hereinafter, referred to as board P), and in FIG. 1, the conveyance direction of board P is the x-direction, the width direction of board P is the y-direction, and the thickness direction of board P is the z-direction. The y-direction and the z-direction are the front-rear direction and the up-down direction of the mounting machine, respectively. The x, y, and z directions are orthogonal to each other. Component supply device 6 supplies electronic component (hereinafter, referred to as component) s to be mounted on board P and includes multiple tape feeders 14 and the like. Head moving device 8 holds mounting head 16 and moves mounting head 16 in the x, y, and z directions, and mounting head 16 has suction nozzle 18 that picks up and holds component s.

Reference numeral 20 indicates a camera. Camera 20 captures an image of component s held by suction nozzle 18, and it is determined whether component s is to be mounted on board P based on the image captured by camera 20. Reference numeral 22 indicates a measurement device. Measurement device 22 measures the electrical characteristics of component s. The electrical characteristics of component s include L (inductance), C (capacitance), R (resistance), Z' (impedance), and the like, and one or more of these characteristics are measured by measurement device 22.

Measurement device 22 is provided in a main body of circuit board conveyance and holding device 4 via waste box 26. Waste box 26 and measurement device 22 are connected by way of discard passage 28. Components s whose electrical characteristics have been measured are accommodated in waste box 26 via discard passage 28.

Figure 2:
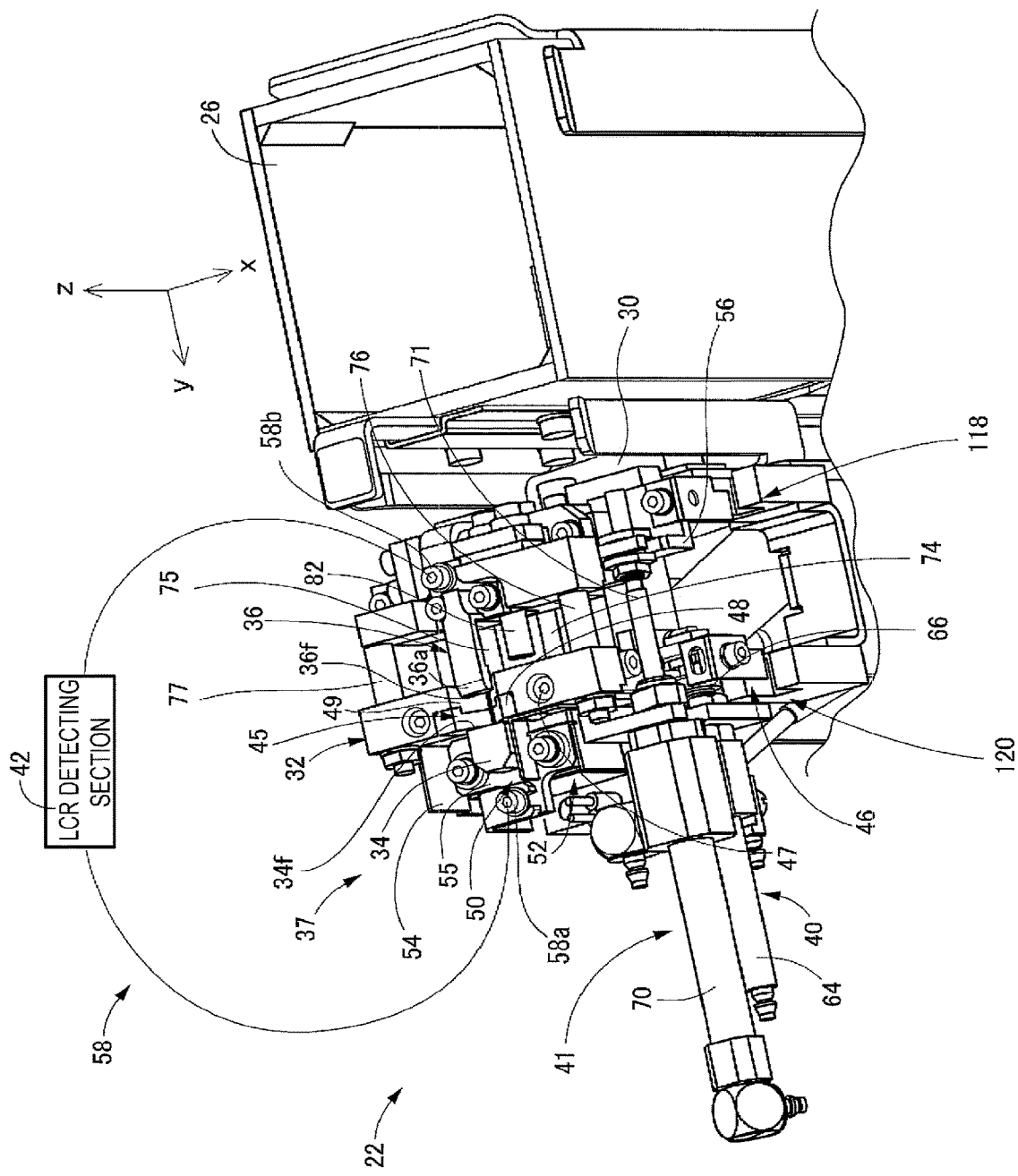
FIG. 2 is a perspective view of the measurement device.
Figure 3:
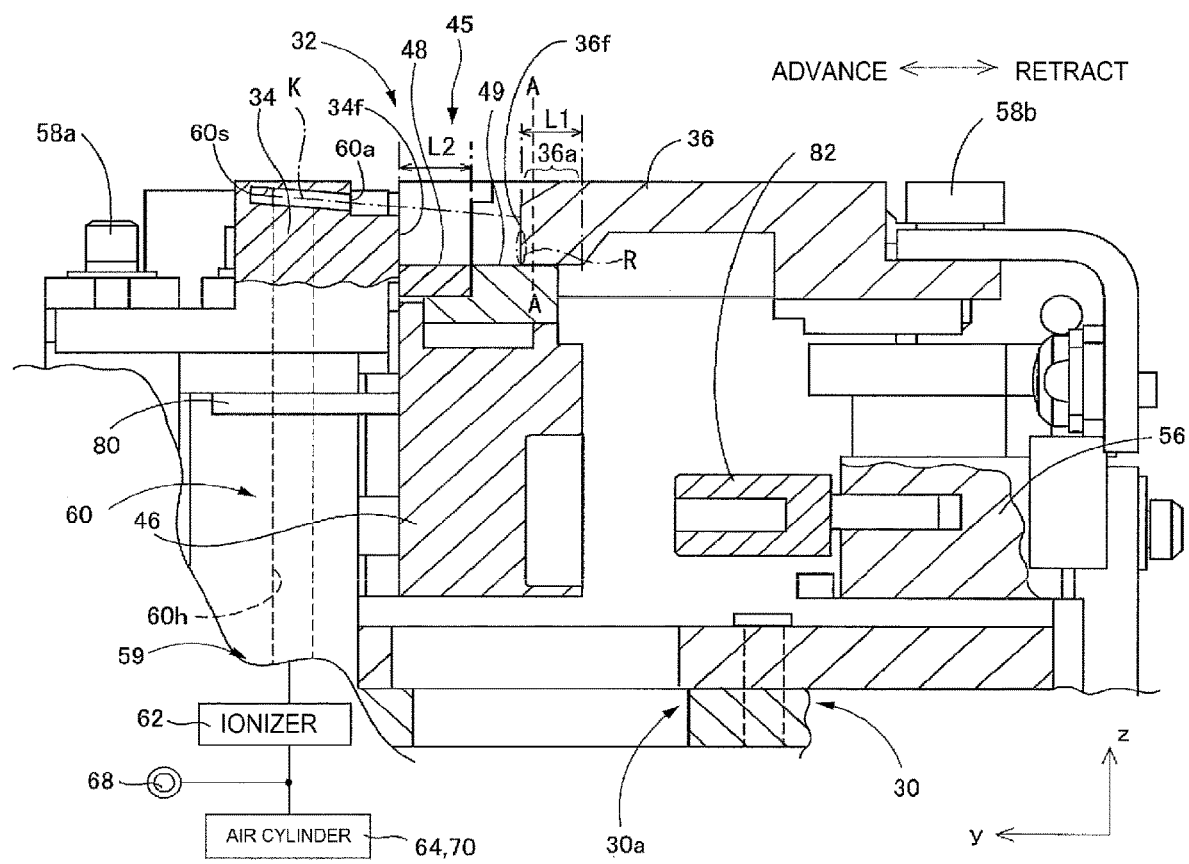
FIG. 3 is a sectional view of a main part of the measurement device.

As shown in FIGS. 2 to 6, measurement device 22 includes (i) main body 30; (ii) measurement table 32 provided with a component holding section capable of holding components; (iii) a pair of measurement parts 37 including stationary part 34 and movable part 36; (iv) measurement table moving device 40 that moves measurement table 32; (v) movable part moving device 41 that moves movable part 36 so that movable part 36 approaches/separates from stationary part 34; and (vi) LCR detecting section 42 as an electrical characteristic detecting section. In the present embodiment, component s has electrodes at both ends, and the pair of measurement parts 37 can grip the electrodes of component s. Examples of component s include a chip type component. As shown in FIGS. 2 and 3, measurement device 22 is attached to a main body of circuit board conveyance and holding device 4 in an orientation in which movement directions of movable part 36 and measurement table 32 correspond to the y-direction.

As shown in FIG. 3, opening 30a is provided in the bottom section of main body 30. Opening 30a is in communication with discard passage 28.

Measurement table 32 is held by measurement table holder 46 in an integrally movable manner. Measurement table 32 includes groove 45 as a component holding section which is formed on the top surface thereof. Groove 45 has a stepped shape extending in the y-direction, and includes first groove section 45c in which a pair of side faces extending in the y-direction forms an overall V-shape and second groove section 45s, which is provided at the bottom of first groove section 45c and in which a pair of side faces extend in parallel with each other. Component s is placed and held in the groove 45, and in many cases, component s is held in first groove section 45c when component s is large and component s is held in second groove section 45s when component s is small.

Most of measurement table 32 is made of a material having conductivity (hereinafter, referred to as a conductive material), for example, an aluminum alloy or a stainless material, and is electrically connected to main body 30 via multiple members made of conductive materials (sometimes referred to as internal conduction). Since main body 30 is grounded, measurement table 32 is also grounded. That is, measurement table 32 abuts against measurement table holder 46, and is fixed by fastening section 47, and measurement table holder 46 abuts against main body 30 via stopper 80 (refer to FIG. 3). Measurement table holder 46, stopper 80, main body 30, fastening section 47, and the like are made of a conductive material. Therefore, measurement table 32 is grounded via measurement table holder 46, stopper 80, fastening section 47, main body 30, and the like.

Figure 4:
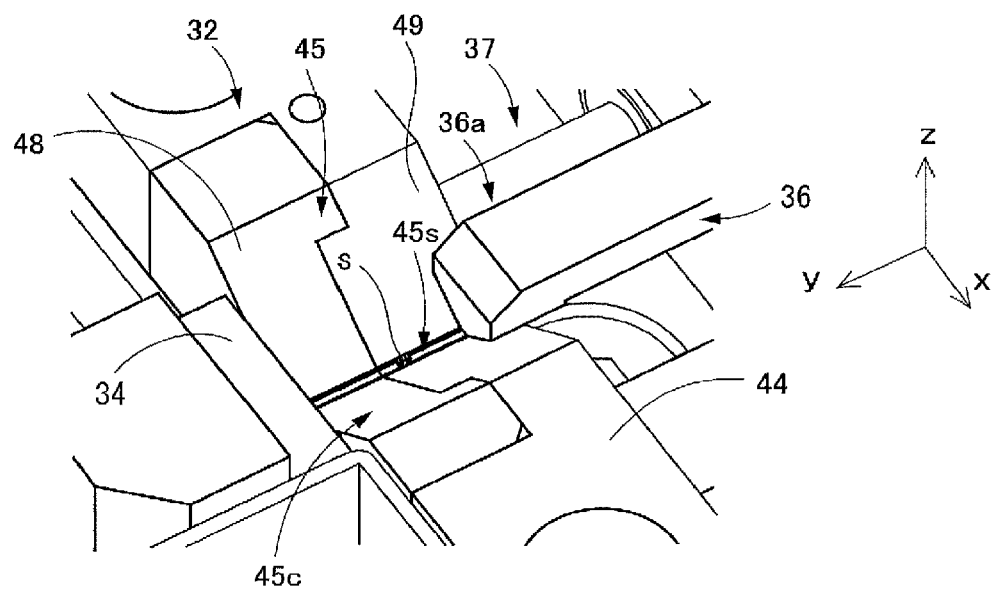
FIG. 4 is a perspective view of the main part of the measurement device.

As shown in FIG. 4, antistatic section 48 made of a material having antistatic properties (hereinafter, referred to as an antistatic material) is provided on a portion of measurement table 32 on the side of stationary part 34 in the y-direction in the vicinity of groove 45. In groove 45, neutralizing section 49 which is made of a conductive material and antistatic section 48 are arranged in the y-direction such that antistatic section 48 is positioned on the advancing side of movable part 36 (i.e., the stationary part side) and neutralizing section 49 is positioned on the retreating side of movable part 36.

The surface resistance of neutralizing section 49 is very small. Therefore, component s can be neutralized by holding component on neutralizing section 49.

The surface resistance of antistatic section 48 is in a range of $10^9 \Omega$ to $10^{13} \Omega$. The antistatic material is a composite made of multiple materials, and examples thereof include a composite produced by kneading an antistatic agent into a resin and a composite produced by applying an antistatic agent to a surface of the resin. Antistatic agents are well known, for example, "PELESTAT" (a registered trademark, manufactured by SANYO CHEMICAL INDUSTRIES CO., LTD.). As described above, since the surface resistance of antistatic section 48 is large, current does not easily flow through antistatic section 48. Therefore, the electrical characteristics of component s can be measured in a state where the component s is held by antistatic section 48.

On the other hand, since the surface resistance of the antistatic material is smaller than that of insulating material, if the energization time to component s is long, current also flows to antistatic section 48, and may result in the electrical characteristics of the component not being accurately detected. However, such a problem does not arise because the time required for measuring the electrical characteristics of component s is short. As described above, since the antistatic material has a surface resistance smaller than that of insulating material, static electricity is hardly generated in antistatic section 48, and thus the antistatic material is hardly charged. Therefore, even if friction occurs in antistatic section 48 due to movement of component s, generation of static electricity is suppressed and charging is prevented. As described above, the surface resistance of the antistatic material is larger than that of conductive material and smaller than that of insulating material. Therefore, the antistatic material has a characteristic that electricity hardly flows and is hardly charged. This characteristic makes it possible to measure the electrical characteristics of component s in a state where component s is held by antistatic section 48, and moreover, it is possible to obtain a unique effect of measuring electrical characteristics with high accuracy.

Cover section 50 is attached to the stationary part 34 side of measurement table 32. As will be described later, cover section 50 prevents the flying off of a dropped component s due to ejection of air in addition to preventing the diffusion of air. Cover section 50 includes a pair of covering plate sections 52 and 54 respectively provided on both sides of groove 45 and spaced apart from each other in the x-direction. Covering plate sections 52 and 54 respectively extend in the y-direction and the z-direction, that is, in the movement direction and the up-down direction of measurement table 32 and movable part 36.

Stationary part 34 and movable part 36 are provided so as to approach and separate from each other. Stationary part 34 is fixed to main body 30 via stationary part holder 55. Movable part 36 is held by movable part holder 56 at one end (i.e., the end on the retreating side) thereof, and is integrally movable with movable part holder 56.

Figure 5:
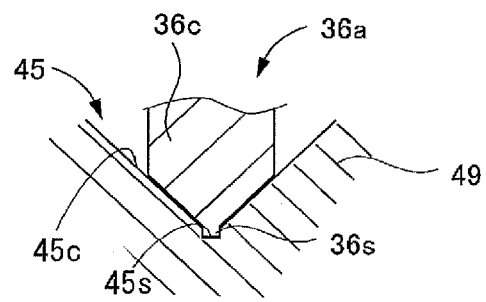
FIG. 5 is a sectional view along line A-A in FIG. 3.

As shown in FIG. 3, engaging section 36a engageable with groove 45 of measurement table 32 is provided at the other end (i.e., the end on the advancing side) of movable part 36. As shown in FIG. 5, engaging section 36a has a stepped shape matching with groove section 45. Engaging section 36a has first engaging section 36c projecting in a triangular shape and extending downward, and second engaging section 36s further projecting downward from the vicinity of the apex of first engaging section 36c and having a square cross section. First engaging section 36c engages with first groove section 45c, and second engaging section 36s engages with second groove section 45s. In the present embodiment, at least a part of engaging section 36a is always engaged with groove 45. Therefore, the gap between engaging section 36a and groove 45 can be made very small.

Stationary part 34 and movable part 36 constitute the pair of measurement parts 37. Stationary part 34 and movable part 36 have opposing surfaces 34f and 36f facing each other, and component s is gripped by the pair of opposing surfaces 34f and 36f. That is, electrical circuit 58, including component s, the pair of measurement parts 37, LCR detecting section 42, a power supply device (not shown), and the like is formed in a state where the electrodes at both ends of component s and the pair of measurement parts 37 are in contact with each other (an energization state). In a state where a voltage is applied between stationary part 34 and movable part 36, current flowing therebetween is detected by LCR detecting section 42 and the electrical characteristics of component s are acquired based on the applied voltage and the flowing current. LCR detecting section 42 is not limited to a detection section that detects L, C, and R and may be a detection section which can detect one or more physical quantities representing electrical characteristics such as L, C, R, and Z'. Reference numerals 58a and 58b of FIGS. 2 and 3 indicate connecting sections of the pair of measurement parts 37 to electrical circuit 58.

Measurement device 22 includes air supply device 59. As shown in FIG. 3, air supply device 59 includes air passage 60, ionizer 62, air source 68, and the like. Air passage 60 includes internal passage 60h formed in stationary part holder 55 and main body 30, and air ejection passage 60s formed in stationary part 34, and the like. Air ejection passage 60s extends generally in the y-direction and inclines downward as it approaches movable part 36, and opening 60a faces opposing surface 36f of movable part 36. In addition, extension line K of air ejection passage 60s reaches slightly above portion R of opposing surface 36f of movable part 36 which frequently grips component s (that is, a gripping section) when movable part 36 is at a position separated from stationary part 34. Air supplied through air ejection passage 60s is blown on opposing surface 36f obliquely from above. Air source 68 and the like are connected to air passage 60 via ionizer 62. Ionizer 62 ionizes air by causing corona discharge and supplies the ionized air.

Figure 6:
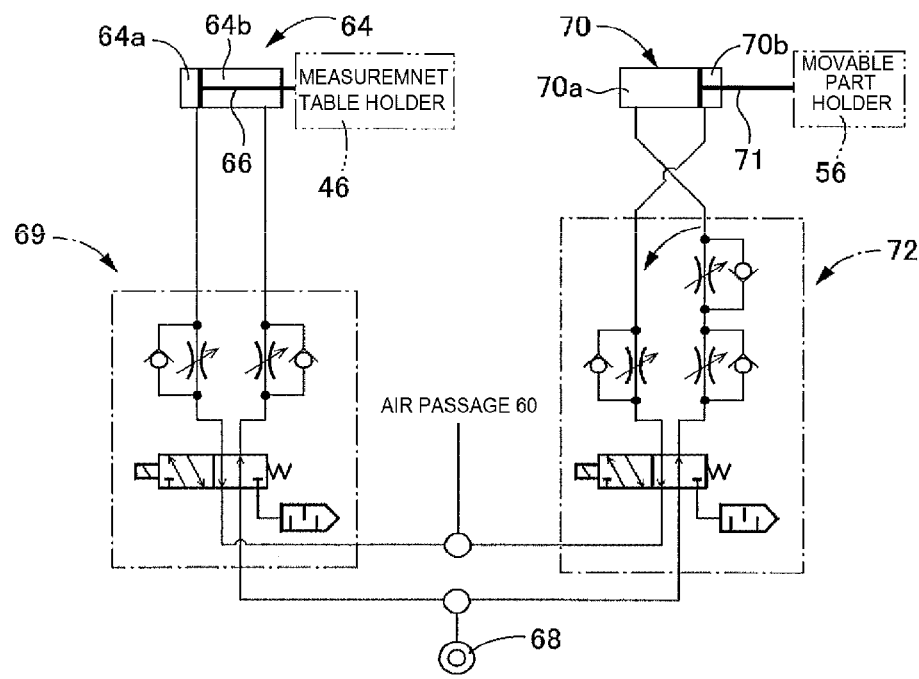
FIG. 6 is a diagram illustrating an air circuit included in the measurement device.

Measurement table moving device 40 moves measurement table 32 and includes air cylinder 64 as a driving source. As shown in FIG. 6, in air cylinder 64, the interior of the housing is partitioned into two air chambers 64a and 64b by a piston, and measurement table holder 46 is connected to piston rod 66 of the piston. Electromagnetic valve device 69 is provided between the two air chambers 64a, 64b and air source 68, air passage 60, and a filter (atmosphere). Electromagnetic valve device 69 includes multiple electromagnetic valves and measurement table 32 advancing and retreating under the control of electromagnetic valve device 69. When measurement table 32 advances, air source 68 is communicated with air chamber 64b, and air passage 60 is communicated with air chamber 64a. Therefore, as measurement table 32 advances, air is supplied from air chamber 64a to air passage 60.

Movable part moving device 41 moves movable part 36, and includes air cylinder 70 as a driving source. Similarly, in air cylinder 70, two air chambers 70a, 70b partitioned by the piston are formed inside the housing, and movable part holder 56 is connected to piston rod 71 of the piston. Air source 68, air passage 60, and a filter (atmosphere) are connected to the two air chambers 70a, 70b via electromagnetic valve device 72. Electromagnetic valve device 72 causes movable part 36 to advance and retreat. When movable part 36 retreats, the air source communicates with air chamber 70a, and air passage 60 communicates with air chamber 70b. Therefore, air is supplied from air chamber 70b to air passage 60 with the retreat of movable part 36. As described above, air cylinders 64 and 70 also function as an air source of air supply device 59.

As shown in FIG. 2, a pair of guide rods 74 and 75 extending in the y-direction is provided between main body 30 or stationary part holder 55 and movable part holder 56, and a pair of guide rods 76 and 77 extending in the y-direction is provided between measurement table 32 and movable part holder 56. Guide rods 74, 75, 76, and 77 allow stationary part 34 and movable part 36 to move relative to each other in the y-direction, and allow measurement table 32 and movable part 36 to move relative to each other in the y-direction. As shown in FIG. 3, stopper 82 is provided on the stationary part side of movable part holder 56, and stopper 80 is provided on main body 30 or stationary part holder 55. Stopper 82 defines an approach limit between movable part holder 56 and measurement table 32 (measurement table holder 46), and stopper 80 defines an approach limit between stationary part 34 and measurement table 32 (measurement table holder 46).

Figure 7:
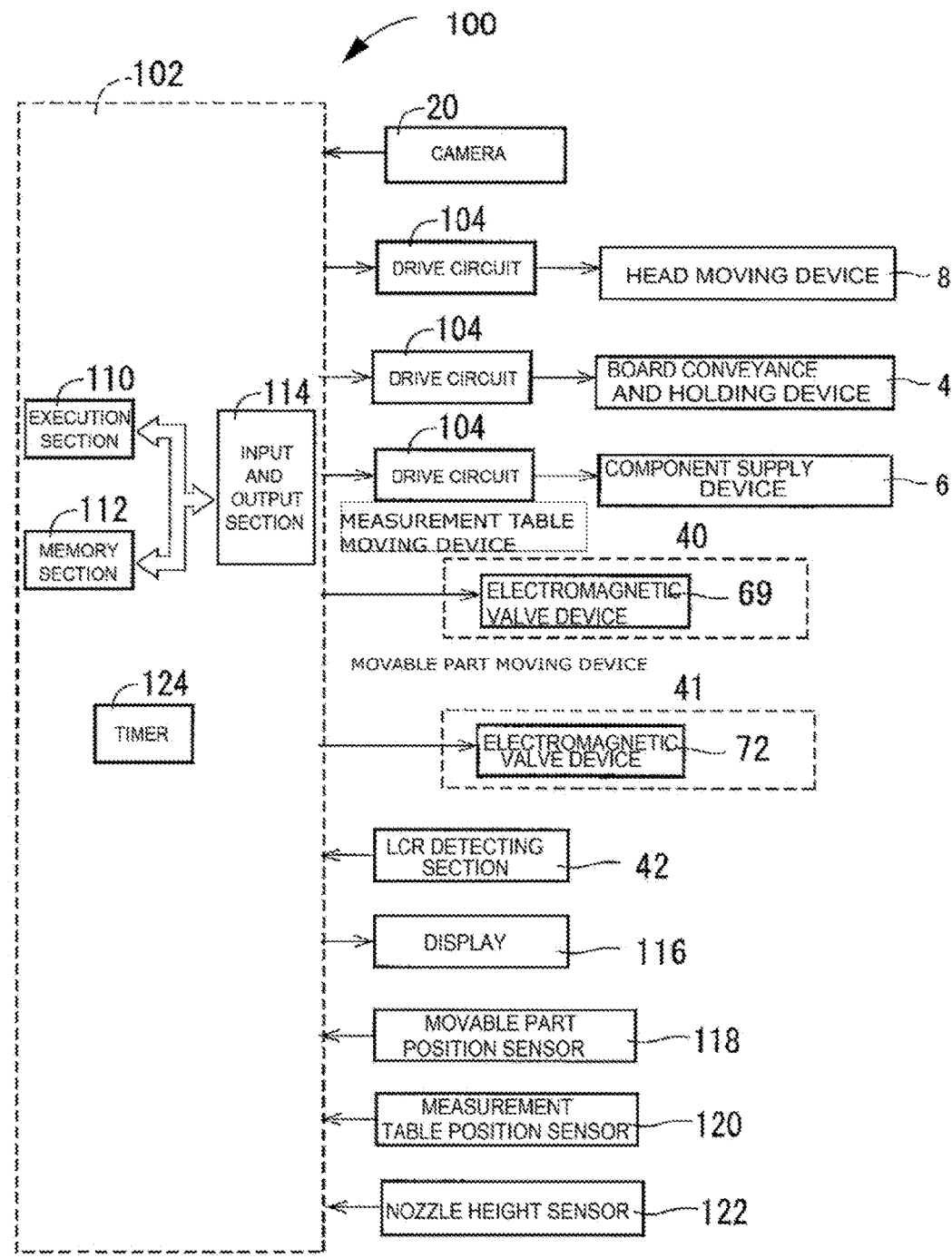
FIG. 7 is a schematic diagram illustrating a control device in the mounting machine.

The mounting machine includes control device 100. As shown in FIG. 7, control device 100 includes controller 102, mainly composed of a computer and multiple drive circuits 104. Controller 102 includes execution section 110, memory section 112, input and output section 114, and the like. Input and output section 114 is connected to board conveyance and holding device 4, component supply device 6, and head moving device 8 via drive circuit 104, and is also connected to measurement table moving device 40, electromagnetic valve devices 69 and 72 of movable part moving device 41, and the like. Also, input and output section 114 is connected to LCR detecting section 42, display 116, movable part position sensor 118, measurement table position sensor 120, nozzle height sensor 122 that measures the height of nozzle 18, and the like. Memory section 112 stores multiple programs such as the LCR measurement program and tables shown in the flowchart of FIG. 8. The time is measured by timer 124 provided in controller 102. In the present embodiment, electromagnetic valve devices 69 and 72 are controlled by using the outputs of measurement table position sensor 120 and movable part position sensor 118 and the time measured by timer 124, to advance and retract measurement table 32 and movable part 36.

Hereinafter, the operation of the mounting machine will be described. When a command for measuring the electrical characteristic of component s is issued such as when new tape feeder 14 is set or tape feeder 14 is exchanged, the electrical characteristics of component s held on tape feeder 14 are measured. It is also possible to compare the measured value, which is the value of the measured electrical characteristic, with the standard value of the component, and determine whether the measured value and the standard value substantially coincide with each other. In that case, the result of the comparison between the measured value and the standard value can be displayed on display 116.

Figure 8:
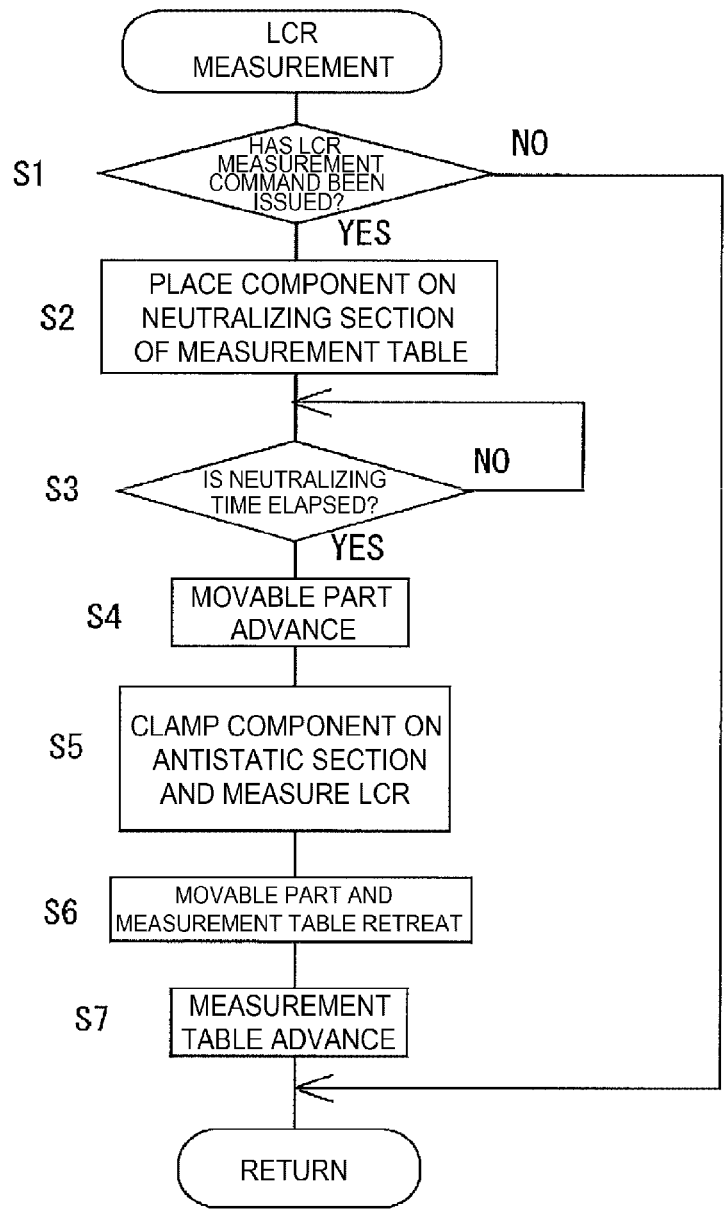
FIG. 8 is a flowchart showing an LCR measurement program stored in a memory section of the control device.

The electrical characteristics of component s are measured by executing LCR measurement program shown in flowchart of FIG. 8. In an inactive state of the mounting machine, measurement device 22 is in the initial state shown in FIG. 9A. Movable part 36 is in a retreating end position and measurement table 32 is in the advanced end position. Since measurement table 32 is in contact with stopper 80, neutralizing section 49 is grounded by internal conduction or the like. Further, engaging section 36a of movable part 36 is engaged with neutralizing section 49 of groove section 45 of measurement table 32.

In step 1 (hereinafter, referred to as S1; the same applies to the other steps), it is determined whether a command for measuring the electrical characteristics of component s has been issued. When a measurement command is issued, in S2, mounting head 16 is moved. Then component s (for example, a component held on newly mounted tape feeder 14) is picked up by suction nozzle 18 and is placed and held on the front side of opposing surface 36f of movable part 36 of neutralizing section 49. It can be seen that by suction nozzle 18 being lowered and component s being released, component s is made to be held on neutralizing section 49. When component s is large, it is held in first groove section 45c, and when component s is small, it is held in second groove section 45s.

In S3, the elapsed time while component s is held in neutralizing section 49 is measured, and the set period of time that is the neutralizing time, which is the set time, is allowed to elapse. Each component s held by tape feeder 14 is in a state of being charged by static electricity generated due to vibration caused by conveyance of tape feeder 14 or contact with an object. Charged component s is held by neutralizing section 49 to be neutralized. The neutralizing time is a time required to remove static electricity of a capacitance estimated to be possessed by component s, and can be obtained in advance by experiments, or can be theoretically obtained based on the size, characteristics, or the like of component s.

When the determination in S3 is YES, in S4, the advance of movable part 36 is started under the control of electromagnetic valve device 72. Engaging section 36a of movable part 36 is advanced along groove section 45 of measurement table 32, and when opposing surface 36f abuts on component s, component s is moved from neutralizing section 49 to antistatic section 48 with the advance of movable part 36. The advance of movable part 36 is performed after suction nozzle 18 reaches a lifting end. Then, in S5, component s, while on antistatic section 48, is clamped by opposing surface 36f of movable part 36 and opposing surface 34f of stationary part 34 at the electrodes at both ends. The electrical characteristics of component s are measured while component s is held on antistatic section 48. This state is the measurement state shown in FIG. 9B. As shown in FIG. 3, a length L1 of engaging section 36a of movable part 36 in the y-direction is shorter than a length L2 of antistatic section 48 (L1<L2). In the measurement state, engaging section 36a is at a position separated from neutralizing section 49. Therefore, when current is supplied to the pair of measurement parts 37, leakage of the current passing through neutralizing section 49 can be adequately prevented, and the electrical characteristics of component s can be measured with high accuracy.

When the measurement of the electrical characteristics of component s is completed, in S6, movable part 36 retreats under the control of electromagnetic valve devices 72 and 69, and measurement table 32 retreats until it comes into contact with stopper 82. As shown in FIG. 9C, the front end surface of measurement table 32 is positioned substantially the same as or slightly rearward of opposing surface 36f of movable part 36, and measurement table 32 is not below between the pair of opposing surfaces 34f and 36f. This state is a discarding state. Component s falls downward and is accommodated in waste box 26 via opening 30a and discard passage 28. When movable part 36 retreats, air is ejected from opening 60a of air ejection passage 60s and hits above region R of movable part 36. The space between the pair of opposing surfaces 34f and 36f is covered by cover section 50 in the x-direction. As a result, component s can be further dropped from opposing surface 36f, and flying off of component s can be prevented.

Thereafter, in S7, measurement table 32 is moved forward to the advancing end position by control of electromagnetic valve device 69 and is in the initial state shown in FIG. 9A. When measurement table 32 advances, air is supplied from opening 60a of air ejection passage 60s to opposing surface 36f of movable part 36. Therefore, it is possible to adequately remove the charge from opposing surface 36f of movable part 36. As shown in FIGS. 9A to 9C, in the present embodiment, groove 45 of measurement table 32 and at least a part of engaging section 36a of movable part 36 are always engaged with each other. Therefore, the gap between engaging section 36a and groove 45 can be reduced, and even if component s is small, jamming of component s can be adequately suppressed.

As described above, in the present embodiment, the electrical characteristics of component s are measured in a state where component s is held by antistatic section 48. Therefore, even if component s is small, it is possible to measure the electrical characteristics while preventing component s from flying off. In addition, the electrical characteristics of component s are measured after component s is neutralized while being held on neutralizing section 49. As a result, the electrical characteristics of component s can be measured with high accuracy.

In the present embodiment, execution of S3 corresponds to the neutralizing step, execution of S4 corresponds to the movement step, S5 corresponds to the measurement step, and the execution of S6 corresponds to the discarding step.

Note that step S3 is not absolutely necessary. If the neutralizing time is very short, it can be ignored. In addition, even when the neutralizing time elapses before suction nozzle 18 reaches the lifting end, step S3 is practically unnecessary. This is because movable part 36 is advanced after suction nozzle 18 reaches the lifting end.

In the discarding step, measurement table 32 may retreat after movable part 36 retreats, or movable part 36 and measurement table 32 may retreat almost simultaneously.

The present disclosure can be implemented in a mode in which various changes and improvements are made based on the knowledge of those skilled in the art in addition to the mode described in the above embodiment. For example, the length L1 of engaging section 36a can be 80% or less, 70% or less, 60% or less, 50% or less, 40% or less, 30% or less, 20% or less, or the like of the length L2 of antistatic section 48.

REFERENCE SIGNS LIST

22: measurement device, 30: main body, 30a: opening, 32: measurement table, 34: stationary part, 36: movable part, 36a: engaging section, 34f, 36f: opposing surface, 40: measurement table moving device, 41: movable part moving device, 42: LCR detecting section, 45: groove, 45c: first groove section, 45s: second groove section, 48: antistatic section, 49: neutralizing section, 100: control device Claimable Aspects The following sections describe aspects which can be claimed. (1) A measurement device that is provided on a mounting machine configured to pick up a component supplied from a component supply device and mount the component on a circuit board, the measurement device comprising: a component holding section configured to hold the component; and a pair of measurement parts configured to approach each other and separate from each other, clamp the component held by the component holding section, and measure electrical characteristics of the component, wherein the component holding section includes a neutralizing section made of a conductive material and an antistatic section made of a material having antistatic properties.

(2) The measurement device according to (1), in which the antistatic section has a surface resistance of $10^9\Omega$ or more and $10^{13}\Omega$ or less. The antistatic section used in the measurement device described in (2) has characteristics that make it difficult for current to flow and difficult to charge. In other words, the antistatic section may have a surface resistance such that current hardly flows even if the current is supplied to the component while the component is held by the antistatic section, and such that the component is hardly becomes charged even if friction occurs between the antistatic section and the component. The antistatic section may have a surface resistance value of $10^9\Omega$ to $10^{13}\Omega$.

(3) The measurement device according to (1) or (2), in which the pair of measurement parts include a stationary part and a movable part, and the antistatic section and the neutralizing section are arranged in a movement direction of the movable part such that the antistatic section is located toward the advancing side of the movable part relative to the neutralizing section.

(4) The measurement device according to (3), in which the movable part has an engaging section configured to engage with the component holding section, and the movable part and the component holding section are configured in a state in which at least a part of the engaging section engages with the component holding section even when the movable part is in a retreating end position. At least a part of the engaging section of the movable part is always engaged with the component engaging section. Therefore, the gap between the movable part and the component engaging section can be made small.

(5) The measurement device according to (4), in which the engaging section has a length shorter than that of the antistatic section. When the component is gripped by the engaging section of the movable part and the stationary part, it is desirable for the engaging section to have a length such that the engaging section is in the antistatic section. As a result, when a voltage is applied between the movable part and the stationary part, it is possible to make it difficult for current to leak through the neutralizing section (a part of the component holding section made of conductive material).

(6) The measurement device according to any one of (1) to (5), further including a holding table provided with the component holding section, in which the component holding section is provided on a top face of the holding table and is a groove parallel to a movement direction of the pair of measurement parts.

(7) The measurement device according to (6), in which the groove section includes a first groove section in which a pair of side faces forms an overall V-shape, and a second groove section which is provided in the bottom of the first groove section and in which a pair of side faces extend in parallel with each other. By forming the component holding section as a stepped groove, it is possible to adequately hold the component even if the component is large or small.

(8) The measurement device according to any one of (1) to (7), further including an electrical characteristic acquisition section that detects current flowing between the pair of measurement parts and acquires electrical characteristics of the component in a state where a voltage is applied between the pair of measurement parts.

(9) A measurement method of measuring electrical characteristics of the component in the measurement device according to any one of (3) to (8), the method including: a movement step of moving the component, held in front of the movable part on the neutralizing section of the component holding section, to the antistatic section by advancing the movable part; and a measurement step of gripping the component on the antistatic section with the pair of measurement parts and measuring electrical characteristics of the component.

(10) The measurement method according to (9), in which the measurement device includes a measurement table provided with the component holding section, and the method further comprises, a discarding step of discarding the component by retracting the movable part and the measurement table after the measurement step.

(11) The measurement method according to (9) or (10), further including, a neutralizing step of keeping the movable part held on the neutralizing section for a set period of time before the movement step. It is not absolutely necessary to provide the neutralizing step. This is because the set period of time may be made very short when the component is small.

The invention claimed is:

1. A measurement device that is provided on a mounting machine configured to pick up a component supplied from a component supply device and mount the component on a circuit board, the measurement device comprising:
   a component holding section configured to hold the component; and
   a pair of measurement parts including a stationary part and a movable part configured to approach and separate from the stationary part, clamp the component held by the component holding section, and measure electrical characteristics of the component,
   wherein the component holding section includes a neutralizing section made of a first material that is conductive and an antistatic section made of a second material having antistatic properties, the first material and the second material adjacently arranged in a movement direction of the movable part.

2. The measurement device according to claim 1, wherein the antistatic section has a surface resistance of $10^9\Omega$ or more and $10^{13}\Omega$ or less.

3. The measurement device according to claim 1, wherein the movable part approaches the stationary part by moving forward, and
   the antistatic section and the neutralizing section are arranged in the movement direction of the movable part such that the antistatic section is located toward an advancing side of the movable part relative to the neutralizing section.

4. The measurement device according to claim 3, wherein the movable part has an engaging section configured to engage with the component holding section, and
   the movable part and the component holding section make a structure in which at least a part of the engaging section engages with the component holding section even when the movable part is in a retreating end position.

5. The measurement device according to claim 4, wherein the engaging section has a length shorter than that of the antistatic section.

6. A measurement method of measuring electrical characteristics of the component in the measurement device according to claim 3, the method comprising:
- a movement step of moving the component, held in front of the movable part on the neutralizing section of the component holding section, to the antistatic section by advancing the movable part; and
- a measurement step of gripping the component on the antistatic section with the pair of measurement parts and measuring electrical characteristics of the component.

7. The measurement method according to claim 6, wherein
- the measurement device includes a measurement table provided with the component holding section, and
- the method further comprises, after the measurement step, a discarding step of discarding the component by retracting the movable part and the measurement table.

8. The measurement method according to claim 6, wherein the measurement method further comprising a neutralizing step of neutralizing electricity of the component by keeping the component held on the neutralizing section for a set period of time before the movement step.

* * * * *